(12) United States Patent
Omoumi et al.

(10) Patent No.: US 9,660,621 B1
(45) Date of Patent: May 23, 2017

(54) LARGE DYNAMIC RANGE ANALOG SIGNAL CONDITIONING METHOD AND DEVICE WITH ACTIVE ACCURACY ENHANCEMENT

(71) Applicant: Technology for Energy Corporation, Knoxville, TN (US)

(72) Inventors: Kevin Christopher Omoumi, Cookeville, TN (US); Allen Vaughn Blalock, Louisville, TN (US); Kai Bouse, Loudon, TN (US)

(73) Assignee: Technology For Energy Corporation, Knoxville, TN (US)

( * ) Notice: Subject to any disclaimer, the term of this patent is extended or adjusted under 35 U.S.C. 154(b) by 50 days.

(21) Appl. No.: 14/872,056

(22) Filed: Sep. 30, 2015

Related U.S. Application Data

(60) Provisional application No. 62/057,758, filed on Sep. 30, 2014.

(51) Int. Cl.
*G01R 1/38* (2006.01)
*H03K 5/02* (2006.01)
*H03K 5/24* (2006.01)

(52) U.S. Cl.
CPC .............. *H03K 5/02* (2013.01); *H03K 5/24* (2013.01)

(58) Field of Classification Search
CPC ...... G01R 13/02; G01R 15/002; G01R 15/08; G01R 15/09; G01R 15/125; G01R 17/04; G01R 19/165; G01R 19/1659; G01R 1/0458; G01R 1/06705; G01R 15/12; G01R 19/17; G01R 23/155; G01R 29/033; G01R 31/2872; G01R 31/2881; G01R 31/2887; G01R 11/56; G01R 11/57; G01R 11/58; G01R 11/63; G01R 11/64

See application file for complete search history.

(56) References Cited

U.S. PATENT DOCUMENTS

| | | |
|---|---|---|
| 5,153,510 A | 10/1992 | Kominsky |
| 6,070,058 A | 5/2000 | Waldroup et al. |
| 6,194,910 B1 | 2/2001 | Davis et al. |
| 6,603,301 B2 | 8/2003 | Benes |
| 7,233,615 B1 * | 6/2007 | Aikawa ............... H04B 1/7117 370/342 |
| 7,538,539 B1 | 5/2009 | Balke |
| 7,615,988 B2 | 11/2009 | Blakely |
| 8,143,880 B2 | 3/2012 | Vulovic et al. |
| 2011/0181337 A1 * | 7/2011 | Otsuga ............. G01R 31/31725 327/332 |
| 2013/0317767 A1 * | 11/2013 | Mori ..................... G01R 27/28 702/57 |
| 2014/0253102 A1 | 9/2014 | Wood et al. |
| 2014/0306690 A1 | 10/2014 | Hewson et al. |

* cited by examiner

*Primary Examiner* — Tung X Nguyen
(74) *Attorney, Agent, or Firm* — Pitts & Lake, P.C.

(57) ABSTRACT

An analog signal conditioning device and method employing a multi-path feedback mechanism to actively minimize the error of the overall desired signal conditioning transfer function to produce a corrected output signal, initially and over temperature, by exploiting characteristics of resistances manufactured simultaneously on a common thermally conductive substrate.

48 Claims, 5 Drawing Sheets

LARGE DYNAMIC RANGE ANALOG SIGNAL CONDITIONING METHOD AND DEVICE WITH ACTIVE ACCURACY ENHANCEMENT

CROSS-REFERENCE TO RELATED APPLICATIONS

This application claims the benefit of U.S. Provisional Patent Application Ser. No. 62/057,758, filed on Sep. 30, 2014, the contents of which are incorporated herein by reference in its entirety.

FIELD OF INVENTION

The present general inventive concept relates to conditioning of analog signals in applications where a large dynamic range of input signals must be measured with relatively high accuracy of reading (0.5% or better), initially and across temperature, but where cost and size preclude the extensive use of expensive parts and/or time consuming calibration mechanisms.

BACKGROUND

Many analog signal measurement applications present unique challenges, but high-accuracy field applications can be especially difficult. Environmental conditions, particularly temperature, have known effects on electronic components, but these effects can be costly to prevent or correct, especially across multiple components in combination. The dynamic range of signals that must be supported may impose additional constraints, particularly where personal safety is an issue.

One exemplary field application is that of electric service metering accuracy verification in the electric utilities industry. Metering installations are frequently outdoors and located in areas as diverse as the sub-arctic and the tropics necessitating stability over a large temperature range such as −20 to 70° C. Peak input voltages are commonly as high as 1000 VAC and, for the application of determining burden across a current transformer, may be as low as 10's of milliVolts (0.01 VAC). This demanding 5 decade input range is difficult to support, especially as the low range values need to be acceptably accurate, and particularly in an easily portable device. Regulatory requirements (ANSI, PUC) typically require better than 0.05% (500 ppm) accuracy in scenarios verifying a 0.2% field device, and may require 0.02% (200 ppm) or better accuracy as advances are made in field delivery technology.

A typical historical approach to cover large input signal ranges has been to create multiple overlapping input ranges with multiple gain stages to accommodate the most common subsets of the overall input signal range, and then switch measurement circuitry between ranges, either manually or automatically, as the signal varies.

Another approach using modern electronic circuits is to utilize a large register ADC (24-bit) to cover the entire range, but on a 1000 VAC range this can result in a single bit difference affecting the low level measurements by roughly 0.3% (at 20 mV), which is an unacceptably large proportion of the desired measurement accuracy. Additionally, modern ADC devices generally have pipelined architectures, and switching ranges typically causes a loss of data acquisition continuity. This can cause issues in applications like electric power measurement where acquisition must be continuous for time-normalized accuracy.

Mechanisms for minimizing and/or correcting the effects of environmental factors have historically been expensive, bulky, or both. They may also be expensive to apply in time, as when complex factory calibration procedures are used to periodically quantify and apply corrections. They may further be unacceptable due to subtle manufacturing details or scarce critical parts with long lead times.

These and other problems lead to various design goals that may be particularly desirable in a portable field measurement device: small physical size; ease of use; an optimum combination of high measurement accuracy over temperature and time; minimal energy consumption (i.e., long battery life); robustness in the field; low cost to manufacture; temperature-independent calibration; as well as other similar factors that may arise during manufacture and/or implementation of such devices.

While various combinations of these problems have presented challenges that have inspired numerous conventional approaches, there still exists a desire for a way in which many measurement applications may be separated into application subranges which are a priori mutually exclusive, obviating the need for dynamic switching during acquisition, and in which certain aspects of manufacturing electronic components can be profitably utilized to good effect.

BRIEF SUMMARY

Example embodiments of the present general inventive concept provide an analog signal conditioning device and method employing a multi-path feedback mechanism to actively minimize the error of the overall desired signal conditioning transfer function to produce a corrected output signal, initially and over temperature, by exploiting characteristics of resistances manufactured simultaneously on a common thermally conductive substrate.

Example embodiments of the present general inventive concept may be achieved by providing an active analog signal conditioning circuit including an input signal node to receive an input signal, an output signal node to output an output signal, a reference signal node to output a reference signal, an error correction signal node to output an error correction signal, a forward module configured to condition and sum the input signal and the error correction signal to present the output signal at the output signal node such that the input signal is applied to a first forward sensitivity between the input signal node and the output signal node, and the error correction signal is applied to a second forward sensitivity between the error correction signal node and the output signal node, a reference module configured to condition and sum the output signal and the error correction signal to present the reference signal at the reference signal node such that the reference signal is inverted in sign to the output signal, the output signal is applied to a first reference sensitivity between the output signal node and the reference signal node, and the error correction signal is applied to a second reference sensitivity between the error correction signal node and the reference signal node and a correcting comparison module configured to condition and sum the output signal and the reference signal to present the error correction signal at the error correction signal node such that the output signal is applied to a first comparison sensitivity between the output signal node and the error correction signal node, and the reference signal is applied to a second comparison sensitivity between the reference signal node and the error correction signal node, wherein the second forward sensitivity and the first and second reference sensitivities are configured such that error correction signal components of the reference signal from the respective first and second reference sensitivities are equal in magnitude and inverted in sign, and wherein the forward module and the reference module are configured to each include at least one passive element formed on a same first substrate.

Additional features and embodiments of the present general inventive concept will be set forth in part in the description which follows, and, in part, will be obvious from the description, or may be learned by practice of the present general inventive concept.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which.

DETAILED DESCRIPTION

Figure 1A:
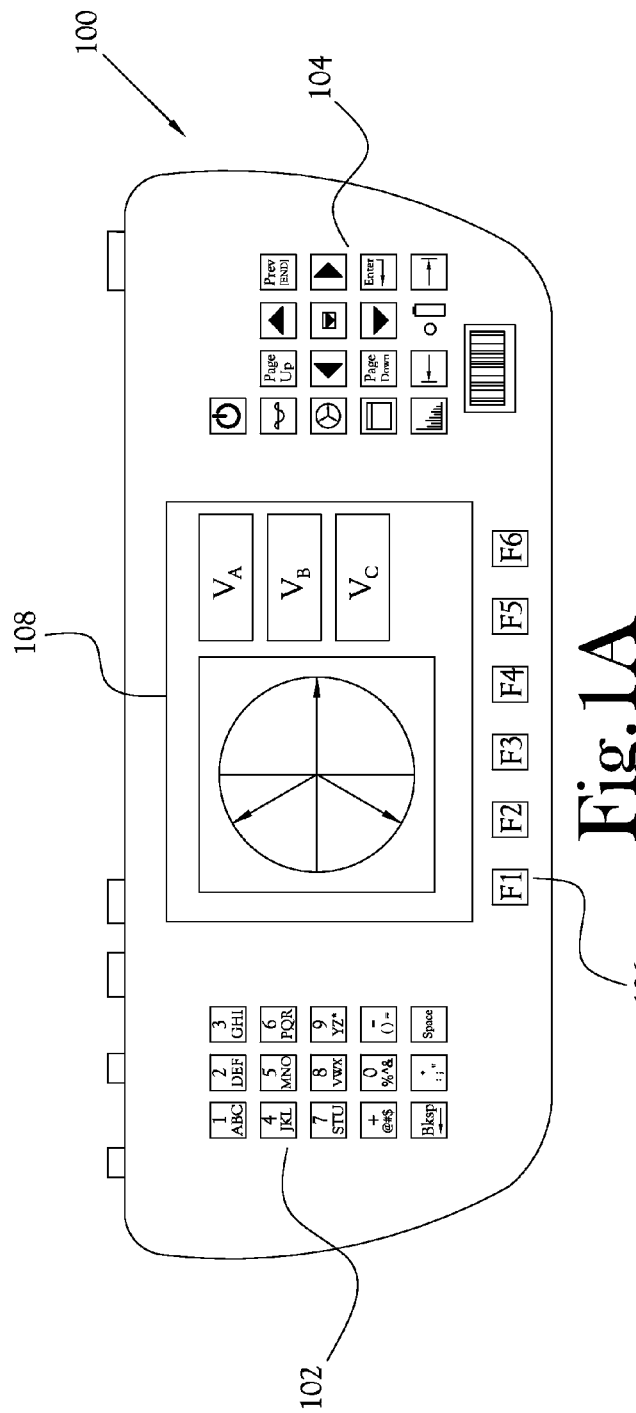
FIGS. 1A-1B illustrate an example embodiment of a handheld field testing device for the electric utility industry according to the present general inventive concept.

Reference will now be made to example embodiments of the present general inventive concept, which are illustrated in the accompanying drawings and illustrations. The example embodiments are described herein in order to explain the present general inventive concept by referring to the figures.

The following detailed description is provided to assist the reader in gaining a comprehensive understanding of the structures and fabrication techniques described herein. Accordingly, various changes, modification, and equivalents of the structures and fabrication techniques described herein will be suggested to those of ordinary skill in the art. The progression of fabrication operations described are merely examples, however, and the sequence and type of operations is not limited to that set forth herein and may be changed as is known in the art, with the exception of operations necessarily occurring in a certain order. Also, description of well-known functions and constructions may be omitted for increased clarity and conciseness.

Note that spatially relative terms, such as "up," "down," "right," "left," "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "resistor" may refer to an embodiment of a resistive element with a precisely designed opposition to the passage of electric current, as commonly used in the electronics industry and which would be readily recognized as a typical circuit component by one of ordinary skill in the art.

As used herein, the term "temperature coefficient of resistance" (TCR) may refer to the following relationship:

$$TCR = \frac{R2 - R1}{R1 \cdot (T2 - T1)} \cdot 10^6$$

In the equation shown above, TCR is the rate of change of resistance for a resistive element specified in ppm/° C., where R1 is the resistance in ohms at a reference room temperature, R2 is the resistance in ohms at a specific operating temperature, T1 is the reference room temperature in ° C., and T2 is the specific operating temperature in ° C., as commonly used in the electronics industry and which would be readily recognized as a typical resistor attribute by one of ordinary skill in the art.

As used herein, the term "high precision" resistor may refer to a resistor typically classified as EIA E192 (accuracy class 0.1% or better) with low TCR (±25 ppm/° C. or better), as commonly used in the electronics industry and which would be readily recognized as a typical resistor attribute by one of ordinary skill in the art.

As used herein, the term "low precision" resistor may refer to a resistor classified as EIA E24 or lower (accuracy class 5% or worse) with typical TCR of (±500 ppm/° C. or worse), as commonly used in the electronics industry and which would be readily recognized as a typical resistor attribute by one of ordinary skill in the art.

As used herein, the term "resistor array" may refer to multiple resistive elements (e.g., resistors) simultaneously manufactured on a common thermally connected and conductive substrate such that the individual resistive elements maintain substantially the same tracking relation, initially and over temperature, said tracking relation between elements being stable within a percentage difference smaller than the percent difference between the absolute resistance value of each element and the manufacturers' nominal specified value. In the case of low precision arrays the inter-element tracking percentage difference may be at least 2 orders better than the specified tolerance of the nominal resistance value.

As used herein, the term "op-amp" may refer to the embodiment of an ideal transistor circuit with a differential input (two inputs of opposite polarity), infinite input impedance, infinite open-loop gain, infinite bandwidth and zero noise, with a single output having zero output impedance, and typically available as a pre-manufactured integrated circuit. Op-amps may be combined with other electronic components to implement scaling transfer functions of less than unity (attenuator), greater than unity (amplifier), or unity (isolating buffer), in addition to other mathematical and utility operations on signals, as is commonly used in the electronics industry and which would be readily recognized as a typical electronic circuit component by one of ordinary skill in the art.

As used herein, the term "equivalent resistances" may refer to resistors having specified nominal values which would produce a ratio of unity if the resistances were ideal (i.e., zero error between the nominal specified and absolute resistance values), as is commonly used in the electronics industry and which would be readily recognized as a typical electronic circuit attribute by one of ordinary skill in the art.

As used herein, the term "sensitivity" may refer to a quantity specified by the amount of change in the output signal of a module due to at least one received input signal of that module. Effectively, the sensitivity is the ratio of the output signal of a given module divided by at least one input signal of the same module such that the sensitivity is substantially equivalent to a transfer function, gain, or attenuation of that module.

As used herein, the term "module" may refer to a portion of a circuit containing various electrical components to act on one or more signals. Different modules of a same circuit described herein may have one or more overlapping portions with other described modules.

As used herein, the term "condition" may refer to one or more changes to one or more attributes of an input signal, such that the "conditioned" output signal has the one or more changed attributes.

As used herein, the term "magnitude" may refer to the absolute value of a signal characteristic, such that the characteristic has a positive value whether the signal is in a positive or negative state.

It is noted that several of the example embodiments described herein may refer to voltage or current as the input and/or output signals being conditioned, measured, and so on. However, the conditioning methods and circuits described herein are not limited to either voltage or current, but rather are capable of conditioning and/or measuring a plurality of types of signals. Also, while the terms "resistor", "resistive elements", etc., are typically used in the following description, it is understood that such terms are interchangeable with "impedance" in the present general inventive concept.

Various example embodiments of the present general inventive concept exploit a characteristic of low precision resistor arrays to condition analog signals, such as voltage levels, with high precision. Low precision resistor arrays, e.g., ±5% or worse tolerance, are readily available at very low cost in values up to $10^7$ ohms. High precision resistor arrays, e.g., ±0.5% or better tolerance, are readily available in resistive values only up to about $10^5$ ohms or less, and are typically more than an order of magnitude more expensive than low precision arrays.

One specific characteristic of resistor arrays exploited by various example embodiments of the present general inventive concept is that the tracking between resistor element values of low precision arrays is typically very close, initially and over temperature. Despite a large percentage difference between the absolute resistance value of each element and the manufacturers' nominal specified value, low precision resistor array elements commonly exhibit tracking differences between individual elements that are often 2 orders of magnitude smaller. The present inventive concept exploits this small percent difference in tracking to provide a conditioned signal fidelity of a comparably small percent error. This is accomplished using low cost high resistance value resistor arrays with absolute uncertainties much larger than the attained signal accuracy.

One example embodiment of the present general inventive concept is a precision active analog signal conditioning circuit that operates over a plurality of orders of magnitude of input signal amplitudes and/or operating temperatures to produce a signal conditioning accuracy on the order of the matching accuracy of the impedances of a plurality of electrical elements manufactured on the same thermally conductive substrate without requiring adjustment for errors initially and/or over temperature.

According to various examples of the present general inventive concept, a signal conditioning circuit is provided that is switchable between high and low value signal ranges. In various example embodiments of the present general inventive concept, a signal conditioning device having such circuitry may be configured as a handheld analyzer.

Figure 1B:
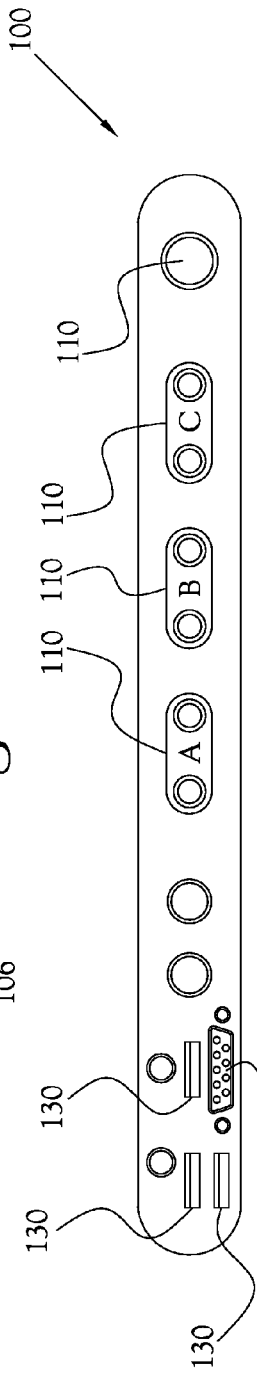

FIGS. 1A-1B illustrate an example embodiment of a handheld field testing device for the electric utility industry according to the present general inventive concept. Various example embodiments of the handheld field testing device 100 may include one or more of the circuits discussed herein used to analyze voltage, current, and/or other aspects associated with electric utilities. While the term "analyze" may be used herein when describing such devices and circuitry, it is understood that such a term may encompass various aspects of signal analysis, such as measurement, which in turn may encompass various types of conditioning, such as signal amplification to change the level of a signal to a more manageable value for, for example, measurement of the signal.

It is understood that the device 100 illustrated in FIG. 1 is merely an example embodiment configured with components to perform one or more of the analyses and/or processes described herein. However, it is understood that the present general inventive concept is not limited to any of the specific elements and/or configurations shown in this or other example embodiments in this description. The drawings described herein include several example embodiments of circuits and equivalent circuits that may be features in the device 100, or a differently configured device according to the present general inventive concept. Such a device may be battery powered, and/or may include an auxiliary power connection.

Several aspects and features of the analog "front-end" circuit designs according to various example embodiments of the present general inventive concept and described herein are either novel outright or, at least, novel as applied within a power standard for the electric power industry. One advantage of such an instrument is to provide power utility companies a cost-effective means of verification of power meters at power customer load points all over the world, regardless of the climate and various other conditions.

The example embodiment of the handheld field testing device 100 illustrated in FIGS. 1A-1B includes a face portion illustrated in FIG. 1A, and a connectivity portion illustrated in FIG. 1B. In the example embodiment illustrated in FIGS. 1A-1B, the face portion and connectivity portion are configured as adjacent surfaces, but it is understood that the present general inventive concept is not limited to such a configuration. For example, the connectivity portion of the device 100 may be configured to be opposite to the face portion, and so on. Further, although various user interactivity features and components are illustrated as being provided on and/or through the face portion of the device 100 in FIG. 1A, it is understood that the illustrated features and/or components may be provided at a plurality of surfaces, sides, etc., of the device 100 according to various example embodiments of the present general inventive concept.

The example embodiment of the face portion of the device 100 of FIG. 1A includes a plurality of user interface keys used to input data, control functionality, etc. The user interface keys may be configured in a variety of ways, such as mechanical buttons, heat or pressure sensors, and so on. In the example embodiment illustrated in FIG. 1A, the user interface keys include an alphanumeric key set 102 used to enter various characters related to data input, and to control an associated curser (space, backspace, etc.), an operational key set 104 used to control various operations of the device 100, and a functional key set 106 used to choose various functions of the device 100. The device 100 of the example embodiment illustrated in FIG. 1A also includes a display 108 to display alphanumeric and/or graphic results of various processes, fields of data entry, and so on. For example, in the embodiment illustrated in FIG. 1A, the display 108 is displaying a vector diagram associated with a three-phase voltage analysis operation. Such a display may include any of a number of values associated with such an operation, and has been simplified in FIG. 1A for ease of understanding.

The example embodiment of the connectivity portion of the device 100 of FIG. 1A includes a plurality of connection ports to connect the handheld device 100 with one or more other devices. Although not illustrated, the handheld device 100 may also be configured to communicate wirelessly by including one or more wireless communication transceivers to communicate in a standard such as Wi-Fi, Bluetooth®, etc. The connection ports may include, for example, direct inputs for AC current, AC voltage, and auxiliary power, various probe inputs, and various other connections such as pulse inputs and pulse outputs, USB ports for peripheral devices and/or connectivity to a PC, an RS232 port for legacy devices, and so on. The example embodiment illustrated in FIG. 1B includes direct inputs 110 for three-phase input of AC current and/or voltage, an RS232 port 120, and a plurality of USB ports 130, as well as other connections such as those discussed above.

Various example embodiments of the handheld device 100 provide a compact handheld design having a low weight, such as, for example, approximately 3.5 pounds, that is capable of protecting revenue in the electric utility industry by performing a host of functions such as diagnosing metering site errors. Example embodiments of the device 100 to perform waveform analysis include an ultra-compact, handheld field instrument with a true three-phase analyzing reference standard that performs various metering site accuracy tests, and operates under actual customer load conditions so a true representation of site accuracy can be verified. Various operations such as, for example, meter testing, CT/PT ratio testing, CT/PT burden measurement, register/demand testing, wiring verification, as well as other operations are all easily performed with the handheld device 100. Various example embodiments of the handheld device 100 may include the three-phase reference standard and may display vector diagrams, voltage and current waveforms, harmonic analysis up to 50th harmonic, meter testing, and register/demand testing. Various example embodiments may include meter site manager software. Various example embodiments may include direct inputs 110 that are rated from 1 mA to 20 A RMS or 20 mV to 600V RMS, may include CT and PT ratio testing, and CT and PT burden measurement. Various example embodiments may include one or two sets of three probe inputs, wherein resolution and range are determined by probe. Various example embodiments may include an auxiliary power connection having 1 input rated 120 to 240 VAC. The pulse inputs may include a meter pulse input and standard input, and the pulse outputs may include a standard output. Various example embodiments may have a display resolution of 640×480, full color transmissive VGA, LED backlit, with a display size of approximately 5.7 inches. The operating temperature for various example embodiments of the device may be −20 degrees Celsius to 50 degrees Celsius, with a storage temperature of −30 degrees Celsius to 60 degrees Celsius, and in a non-condensing humidity of 0 to 95%. Various example embodiments may include an 11.1V Li-Ion rechargeable, 2600 mAh internal battery. Various example embodiments may have dimensions of approximately 11.6 in×6.2 in×2.0 in. The measurement category of the device 100 may be CAT IV 600V. Various example embodiments of the device 100 may measure energy in Wh, VARh, and Vah with a ±0.05% accuracy with direct current channels and ±0.10% accuracy with probe channels, power in Watt, VAR, and VA with a ±0.05% accuracy with direct current channels and ±0.10% accuracy with probe channels, and have a power factor of −1.00 to 1.00. As previously discussed, various example embodiments may measure harmonics in a user selectable fashion up to $50^{th}$ harmonic.

Figure 2:
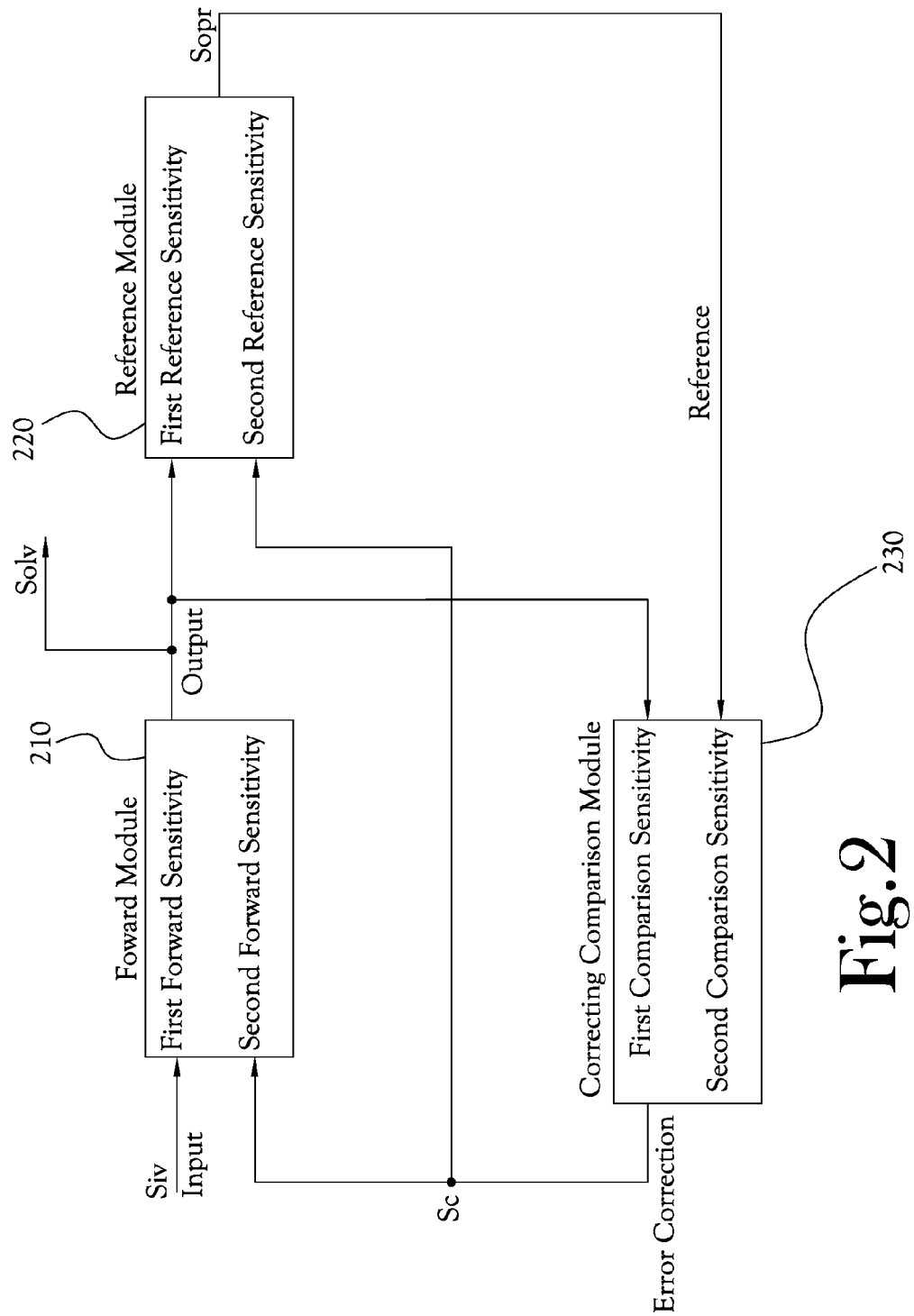
FIG. 2 illustrates a block diagram of various components of a signal conditioning circuit according to an example embodiment of the present general inventive concept.

FIG. 2 illustrates a block diagram of various components of a signal conditioning circuit according to an example embodiment of the present general inventive concept. The block diagram of FIG. 2 illustrates a functional diagram of the example signal conditioning circuit including a forward module 210, a reference module 220, and correcting comparison module 230. These modules 210,220,230 include a plurality of sensitivities that condition an input signal Siv through the use of a reference signal Sopr and an error correction signal Sc in such a way that an output signal Solv is corrected for inaccuracies of circuit elements used to set the desired sensitivity of the output signal to the input signal, initially and over temperature.

The forward module 210 of FIG. 2 includes the superposition of a first forward sensitivity to the input signal Siv and a second forward sensitivity to the error correction signal Sc to produce the conditioned output signal Solv. The error correction signal Sc modulates the output signal Solv to correct for inherent inaccuracies initially and over temperature of at least one passive component of the first forward sensitivity.

The reference module 220 of FIG. 2 includes the superposition of a first reference sensitivity to the output signal Solv and a second reference sensitivity to the error correction signal Sc. These sensitivities produce the conditioned reference signal Sopr such that the reference signal Sopr is responsive to the input signal Siv but has substantially zero responsiveness to the error correction signal Sc. The reference signal Sopr sensitivity due to the error correction signal Sc is substantially zero when the cascaded combination of the second forward sensitivity and the first reference sensitivity is equal in magnitude and inverted in sign to the sensitivity through the second reference sensitivity.

The correcting comparison module 230 of FIG. 2 includes an amplified sum of the output signal Solv and the reference signal Sopr with a weighting of the two signals substantially equivalent to the nominal value of the first reference sensitivity. The reference signal Sopr is also conditioned by the first reference sensitivity of the reference module 220 to be inverted in sign relative to the output signal Solv such that the comparison of the correcting comparison module 230 will be an amplified weighted difference of the reference signal Sopr and the output signal Solv to produce the error correction signal Sc.

In the example embodiment of the present general inventive concept illustrated in FIG. 2, the forward module 210 and the reference module 220 each include at least one passive element formed on a same thermally conductive substrate such that the sensitivities above are substantially affected by the matching errors of the passive elements rather than by the absolute error between the passive element values and their specified nominal values, initially and over temperature.

Another example embodiment of the present general inventive concept exploits a characteristic of low precision resistor arrays to precisely condition signals over more than four decades of dynamic input range. The specific characteristic of resistor arrays exploited by such an example embodiment is that low precision array resistor elements commonly exhibit percent differences between individual element values in an array that are often 2 orders of magnitude smaller than the percent difference between the actual resistance value of each element and the nominal manufacturers' specified value. Essentially, the tracking of resistor element values of low precision arrays is very close initially as well as over temperature. Example embodiments of the present general inventive concept exploit this small percent difference between actual values of low precision resistor array elements to provide accurate signal conditioning of a comparably small percent error. This is accomplished using low cost, high mega-ohm value arrays with absolute uncertainty much larger than the attained conditioning accuracy.

Figure 3:
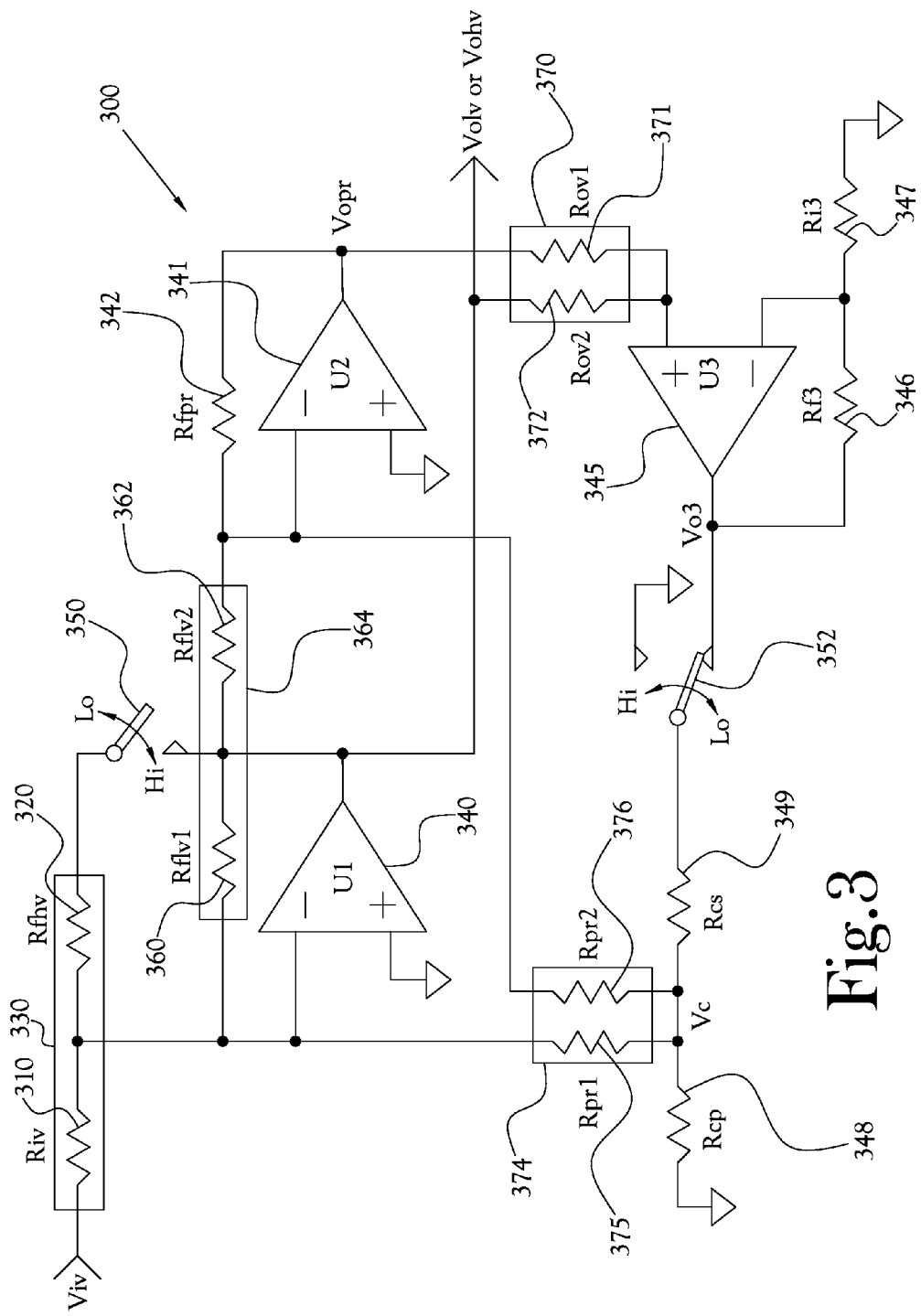
FIG. 3 illustrates a combined signal conditioning circuit for dual range signal conditioning using switches to select between the high range and low range portions of the circuit according to an example embodiment of the present general inventive concept.

One capability of an example embodiment of the present general inventive concept is a low range mode accuracy of an overall greater than four decade signal conditioning circuit. FIG. 3 illustrates a combined signal conditioning circuit for dual range signal conditioning using switches to select between the high range and low range portions of the circuit according to an example embodiment of the present general inventive concept. In the example embodiment illustrated in FIG. 3, a low range of approximately two decades of signals and a high range of approximately two decades of signals may be conditioned according to their respective range. In the example embodiment illustrated in FIG. 3, the voltage node labeled Viv is the input of the circuit. The output signal nodes of the circuit are labeled Volv for low range operation and Vohv for high range operation in FIGS. 4 and 5, which will be described herein, and share a single node in FIG. 3. In the high range operating mode of the present example embodiment, the high range portion of the circuit greatly reduces the size of the maximum input voltage at Viv to a convenient level for measurement at Vohv. This transfer function in this type of feedback amplifier can be approximated by the negative of the ratio of two resistor values, the feedback resistor value Rfhv 320 divided by the input resistor value Riv 310.

In the simple inverting amplifier circuit of the high range portion of the example embodiment illustrated in FIG. 3, the input resistance of the circuit experienced by electrically connected equipment is substantially the input resistor value Riv 310. In this example embodiment, a large resistor of value Riv 310 is utilized for the high range operation to provide a large voltage attenuation transfer function, and is also very good for circuit robustness. A large Riv 310 provides a very light load for and a large current limit to equipment electrically connected to the Viv circuit input.

For the present example embodiment, the input node to both the high and low ranges is the same. For robustness of the circuit, the low range signal conditioning circuit also exhibits a high input resistance value. This compels no change in the resistor value Riv 310 when the circuit is switched from high to low range mode. Since the low range signal conditioning mode has a much smaller predetermined maximum magnitude of input signal, a much smaller voltage attenuation transfer function is required. By switching out the feedback resistor Rfhv 320 so that the resistor Rflv1 360 becomes the amplifier feedback resistance for the low range operating mode, the low range sensitivity is also changed accordingly. In the present example embodiment, the low range feedback resistor Rflv1 360 is configured to be greater than two orders of magnitude larger than value Rfhv 320 to provide the desired transfer function for the lower portion of the total input dynamic range.

In the example embodiment of the present general inventive concept, an inverting amplifier including U1 340, Rflv1 360, and Riv 310 is described above and functions with two additional amplifiers, U2 341 and U3 345, and other resistors of the circuit to correct for the large absolute error of Rflv1 360.

Figure 4:
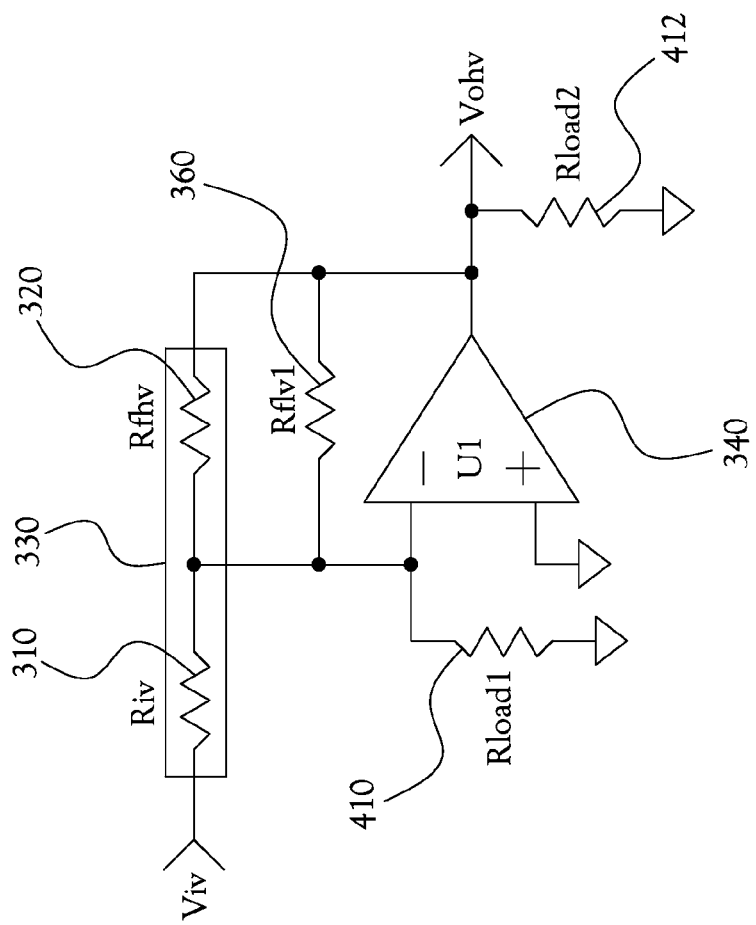
FIG. 4 illustrates an equivalent circuit of the dual range voltage signal conditioning circuit illustrated in FIG. 3 with mode selection switches set in a high range selection position according to an example embodiment of the present general inventive concept.

FIG. 4 illustrates an equivalent circuit of the dual range voltage signal conditioning circuit illustrated in FIG. 3 with mode selection switches set in a high range selection position according to an example embodiment of the present general inventive concept. In the configuration of this example embodiment, the low range components have substantially zero effect on the operation of the high range operation.

In the example embodiment equivalent circuit of FIG. 4, the input loading impedance of the low range Rload1 410 that is presented to the inverting input of the U1 amplifier 340 has negligible effect on the impedance of the inverting input node and therefore the high range circuit operation. The input impedance of the circuit configuration illustrated in FIG. 4 is small as a result of the relatively large open-loop gain of the U1 amplifier 340. Since the loading impedance Rload1 410 is in parallel with the much smaller input impedance of the U1 amplifier 340, substantially all effects from Rload1 410 on the high range operation are negligible.

Loading effects from the low range operation due to the output loading impedance Rload2 412 are also substantially zero. The open-loop output impedance of the U1 amplifier 340 is relatively small due to the properties of a typical voltage amplifier such as that used in the present example embodiment. When configured with feedback as in the circuit illustrated in FIG. 4, the loop gain of the circuit will further decreases the effective output impedance of the U1 amplifier 340. A low output impedance allows this configuration to provide an output signal to load impedances that are relatively small for typical circuits without having signal conditioning degradation. Since the output loading impedance of the low range on the high range operation presents a relatively large impedance to the output node, Rload2 412 has substantially zero effect on the high range operation.

Figure 5:
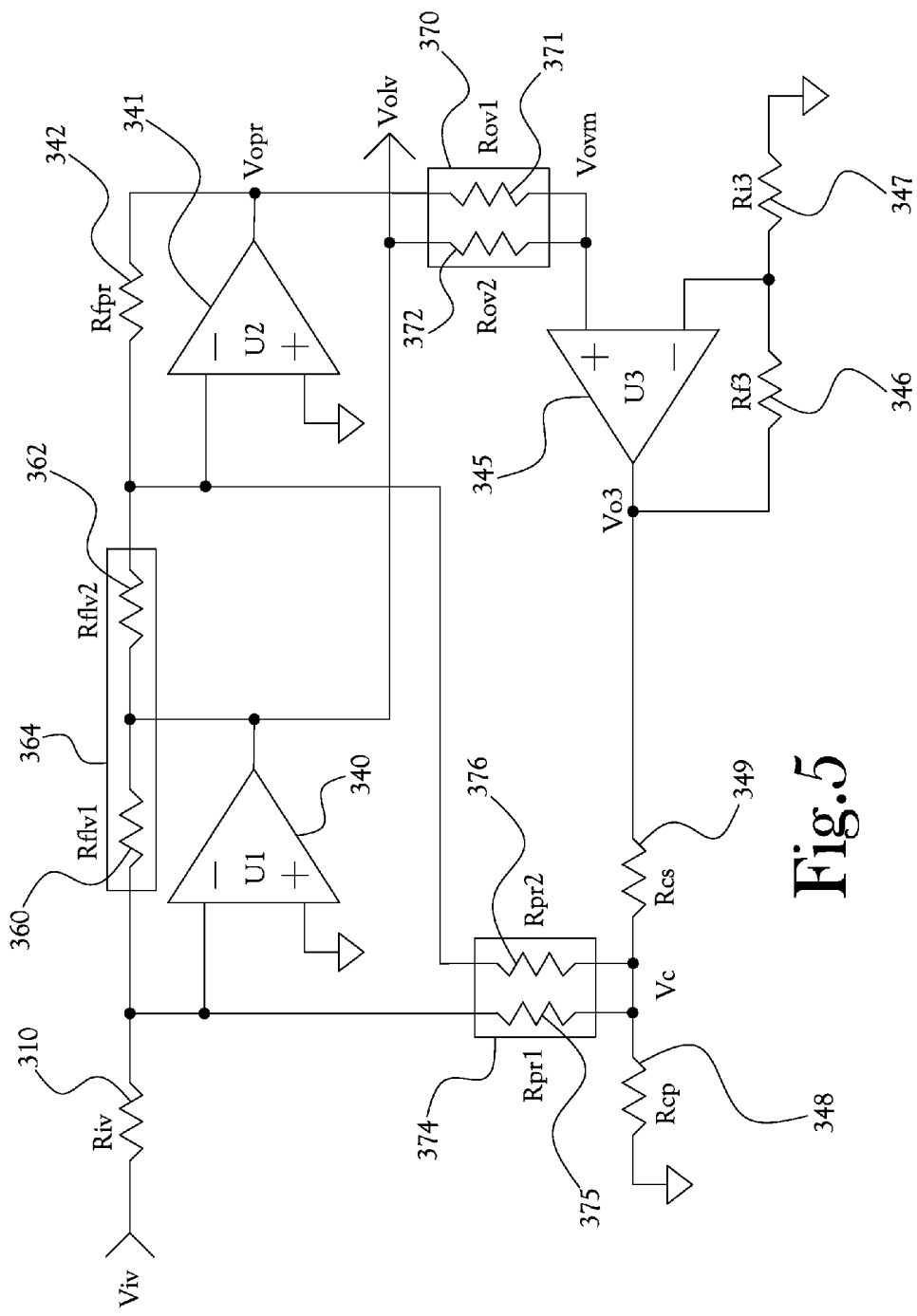
FIG. 5 illustrates an equivalent circuit of the dual range signal conditioning circuit illustrated in FIG. 3 with mode selection switches set in a low range selection position according to an example embodiment of the present general inventive concept.

FIG. 5 illustrates an equivalent circuit of the dual range signal conditioning circuit illustrated in FIG. 3 with mode selection switches set in a low range selection position according to an example embodiment of the present general inventive concept. Note that the high range gain-setting resistor value Rfhv 320 is no longer involved in the circuit operation and will have substantially zero effect on the operation of the low range configuration.

One concern leading to the use of a low precision array 364 for the Rflv1 360 and Rflv2 362 resistors is a desire for a resistor value Rflv1 360 on the order of $10^7$ ohm. Resistor values on this order are not typically readily available, are not generally precision components, and can be very costly. Regardless of the level of precision, resistor elements within a single array are fabricated simultaneously onto a thermally conductive substrate. This keeps all resistor element values on the array nearly equal and their operating temperatures isothermal with one another. Despite the fact that the values of the two resistor elements Rflv1 360 and Rflv2 362 will not be known better than ±5%, they will nonetheless be known to be within ±0.05% of the same value initially and the magnitude of the ratio of Rflv1/Rflv2 will tend to track closely by changing very little over temperature.

Two other resistor arrays of FIG. 5 may be high precision arrays in this example embodiment of the present general inventive concept. One of these high precision arrays 370 includes resistor elements Rov1 371 and Rov2 372, and the other high precision array 374 includes resistor elements Rpr1 375 and Rpr2 376. These are less expensive high precision arrays because their resistor element values are 2 or more orders of magnitude smaller than the resistor values of the Rflv1 360 and Rflv2 362 array 364. As high precision arrays, they exhibit even closer tracking between values of their resistor elements than Rflv1 360 and Rflv2 362, and have absolute values that are known to at worst ±0.1%. A high precision resistor of value Rfpr 342 is also provided to the correction function for precise signal conditioning of this example embodiment of the present general inventive concept. Rfpr 342 may be an inexpensive, high precision component because the desired value can be on the same order of magnitude as Rpr1 375 and Rpr2 376.

In the present example embodiment, Rflv1 360 may be assumed to be substantially equivalent to Rflv2 362 for purposes of simplification and understanding of the present general inventive concept. Since the actual resistance values of Rflv1 360 and Rflv2 362 can be as far off as ±5% from the specified nominal value, the signal conditioning transfer function of the U1 amplifier 340 will exhibit the same level of uncertainty in the absence of a correction function. The accuracy level of the signal conditioning that may be desired in the present example embodiment may be an order of magnitude greater than that of the low precision array at less than ±0.5% total uncertainty of reading. This accuracy level of the present example embodiment may be implemented over a full operating temperature range of minus 20° C. to 70° C. without calibrating at either room temperature or over temperature. In the present example embodiment, the ±5% uncertainty of the Rflv1 360 value does not affect the signal conditioning accuracy when Rflv1 360 is substantially equivalent to Rflv2 362. For simplification of explaining the novelty of the present general inventive concept of the present example embodiment, all other resistor values of the circuit may be assumed to be their respective nominal values; i.e., their errors are neglected.

The reference signal Vopr of the example embodiment circuit of FIG. 5 is determined by two voltage inputs to the U2 inverting amplifier 341, the input signal Viv and Vc, hereinafter referred to as the error correction signal. The U2 amplifier 341 output signal Vopr due to the error correction signal Vc is the superposition (or sum) of the U2 amplifier 341 voltage outputs produced by simultaneous inputs from two distinct paths through the circuit. One path is from the Vc voltage node through the transfer function of the U1 amplifier 340 due to Rpr1 375 and Rflv1 360, cascaded with the transfer function through the U2 amplifier 341 due to Rflv2 362 and Rfpr 342. The second path is from the Vc node through the transfer function of the U2 amplifier 341 due to Rpr2 376 and Rfpr 342. If Rpr1 375 and Rpr2 376 are chosen to be substantially equivalent, as they are in the present example embodiment of FIG. 5, then the transfer functions of the two paths from the Vc voltage node to the U2 amplifier 341 output signal Vopr node will be substantially equal in magnitude and opposite in polarity. In the case that Rfpr 342 is substantially equivalent to Rpr1 375 and Rpr2 376, the first path sensitivity will be substantially unity, and the second path sensitivity will be substantially negative unity. The superposition of the voltage signals due to the transfer functions of the two paths is substantially zero. In this configuration and relative sizing of components, there will be essentially no variation in the reference signal Vopr due to changes in the error correction signal Vc. The reference signal Vopr will only respond to the input signal Viv according to the sensitivity through the U1 amplifier 340 due to Riv 310 and Rflv1 360, cascaded with the sensitivity through the U2 amplifier 341 due to Rflv2 362 and Rfpr 342.

The voltage signal produced at the output signal Volv results from the superposition of both the input signal Viv as by the transfer function of the U1 amplifier 340 due to Riv 310 and Rflv1 360, and the error correction signal Vc by the transfer function of the U1 amplifier 340 due to Rflv1 360 and Rpr1 375. Unlike the reference signal Vopr where the circuit arrangement cancels the effect of the error correction signal Vc, the output signal Volv is directly affected by the error correction signal Vc. As a result of the present example embodiment configuration, the reference signal Vopr is inverted relative to the output signal Volv. Rov1 371 and Rov2 372 create a weighted summing circuit with amplifier U3 345 with inputs of the reference signal Vopr and the output signal Volv, respectively. The ratio of Rov1 371 and Rov2 372 is appropriately sized to be substantially equivalent to the nominal ratio of Rfpr 375 to Rflv2 376. To the extent that Rflv2 362 tracks the value of Rflv1 360, initially and over temperature, the error correction signal Vc modulates the output signal Volv until the weighted sum of the reference signal Vopr and the output signal Volv is substantially zero, recalling that Vopr is inverted compared to Volv. At this point, the output signal Volv has been effectively corrected for the absolute error from nominal of Rflv1 360.

In the example embodiment of FIG. 5, the error correction signal Vc results from the U3 amplifier 345 output voltage Vo3. The U3 amplifier 345 transfer function provides significant amplification of the Rov2 372 and Rov1 371 weighted sum of the output signal Volv and the reference signal Vopr, respectively. The amount of gain from the weighted sum input of the U3 amplifier 345 to the error correction signal Vc signal may be substantial to ensure the correction of Rflv1 360 is dominated by the tracking difference of Rflv1 360 and Rflv2362, initially and over temperature, making the combination of the smaller error components and the substantially infinite open-loop gain amplifier errors negligible. The relatively large gain of the U3 amplifier 345 keeps voltage of the connection node of the Rov1 371 and Rov2 372 resistor elements at substantially zero volts, even when the error correction signal Vc is relatively large. This allows the magnitude of the error correction signal Vc to grow as required to correct the output signal Volv to a level that would result if the resistor value Rflv1 360 was perfect; i.e., when the feedback resistor value Rflv1 360 is at the manufacturer's specified nominal value.

The other resistors Rcp 348, Rcs 349, Ri3 347, and Rf3 346 of the present example embodiment illustrated in FIG. 5 provide compensation for the negative feedback of the correction circuit should compensation be necessary for stability. Each of these resistors may also be a plurality of passive circuit elements to provide the desired compensation. The Rcp 348 and Rcs 349 resistors form a voltage divider that could be modified for phase compensation. The Ri3 347 and Rf3 346 resistors are the gain-setting resistors of U3 345 which can be adjusted to change the gain of U3 345 and can also be modified for compensation if needed.

Through extensive analysis of the present example embodiment, an approximate DC to low frequency transfer function can be derived for the corrected low range output signal Volv due to the input signal Viv shown below. The A3 gain shown below is the effective transfer function from the U3 345 differential input voltage to the error correction signal Vc.

$$\frac{Volv}{Viv} = \frac{-Rflv1}{Riv} \cdot \frac{1}{1 + \left(1 - \frac{Rov2}{Rov1} \cdot \frac{Rfpr}{Rflv2} \cdot \frac{\frac{Rflv2}{Rpr2} \cdot Aov + 1}{\frac{Rfpr}{Rpr2} \cdot \frac{Rov2}{Rov1} \cdot Aov + 1}\right) \cdot \frac{Rflv1}{Rpr1} \cdot Aov}$$

where $$Aov = \frac{Rov1}{Rov1 + Rov2} \cdot A3$$

To further simplify the transfer function of the signal conditioning circuit, the two resistors of the low precision resistor array, Rflv1 360 and Rflv2 362, can be represented as a nominal (or ideal) value Rflvid1 modified by an absolute error abs_err and a tracking error trck_err between the two. Since there can only be an error in tracking between two or more components and for simplification of the transfer function, Rflv1 360 is assumed to only have an absolute error abs_err from the nominal value. Since the two resistances share a common substrate and track one another initially and over temperature, the value of the second resistive element Rflv2 362 will have the same absolute error abs_err of Rflv1 360, but will also be subject to the error in tracking between the two elements trck_err. Using these assumptions and by assuming equivalency of resistor values previously discussed, a simplified transfer function of the low range signal conditioning circuit of the present example embodiment can be found in terms of Rflvid1, Riv, abs_err, and trck_err as shown below.

$$\frac{Volv}{Viv} = \frac{-Rflvidl}{Riv} \cdot \frac{1 + abs\_err}{1 + \frac{trck\_err}{1 + trck\_err} + abs\_err}$$

In regard to various circuit elements discussed in relation to FIGS. 3-5, another example embodiment of the present general inventive concept may provide a precision analog signal conditioning method that uses the low range circuit described above wherein additional resistances (Rfpr, Rpr1, Rpr2) and/or (Rov1, Rov2, Rflv1) and (Riv, Rfhv, Rflv1, Rflv2, Rov1, Rov2, Rfpr, Rpr1, Rpr2) may be combined onto resistor arrays with tighter nominal tolerances to improve accuracy, initially and over temperature, and wherein additional frequency dependent passive and/or active components may be added to provide additional circuit stability and/or phase compensation and/or improved frequency response.

Another example embodiment of the present general inventive concept may provide a precision analog signal conditioning method that operates over a broad range of input signal amplitudes and temperatures to produce high accuracy without requiring temperature effects compensation by implementing a signal conditioning circuit including a sub-circuit having a first high precision resistor (Riv) in series with the input signal (Viv), and a second high precision resistor (Rfhv) in feedback to a first op-amp (U1) producing an output signal (Vohv), where Riv and Rfhv constitute a high precision resistor array, wherein the sub-circuit has an input range of at least 2 decades and produces an output signal (Vohv) which differs from the ideal nominal transfer function by an error no greater than the combined errors of the high precision resistances from their specified nominal values.

Another example embodiment of the present general inventive concept may provide a precision analog signal conditioning method that operates over several orders of magnitude of input signal amplitudes and temperatures to produce high accuracy without requiring temperature effects compensation, including the low range active analog signal conditioning circuit described above, and the high range analog signal conditioning described above, and a switching mechanism whereby either the high range output signal (Vohv) may be selected by simultaneously interrupting the error correction signal (Vc) from op-amp U3 and connecting the Rfhv resistor to be the feedback resistor of op-amp U1; or the low range output signal (Volv) may be selected by simultaneously open-circuiting the Rfhv resistor and allowing the error correction signal (Vc) to reach the input of op-amp U1.

According to another example embodiment of the present general inventive concept, an active analog signal conditioning circuit may include an input signal node to receive an input signal, an output signal node to output an output signal, a reference signal node to output a reference signal, an error correction signal node to output an error correction signal, a forward module configured to condition and sum the input signal and the error correction signal to present the output signal at the output signal node such that the input signal is applied to a first forward sensitivity between the input signal node and the output signal node, and the error correction signal is applied to a second forward sensitivity between the error correction signal node and the output signal node, a reference module configured to condition and sum the output signal and the error correction signal to present the reference signal at the reference signal node such that the reference signal is inverted in sign to the output signal, the output signal is applied to a first reference sensitivity between the output signal node and the reference signal node, and the error correction signal is applied to a second reference sensitivity between the error correction signal node and the reference signal node and a correcting comparison module configured to condition and sum the output signal and the reference signal to present the error correction signal at the error correction signal node such that the output signal is applied to a first comparison sensitivity between the output signal node and the error correction signal node, and the reference signal is applied to a second comparison sensitivity between the reference signal node and the error correction signal node, wherein the second forward sensitivity and the first and second reference sensitivities are configured such that error correction signal components of the reference signal from the respective first and second reference sensitivities are equal in magnitude and inverted in sign, and wherein the forward module and the reference module are configured to each include at least one passive element formed on a same first substrate.

The active analog signal conditioning circuit may be configured to operate over a range of orders of magnitude of input signal amplitudes and/or operating temperatures to produce a signal conditioning accuracy on the order of a matching accuracy of impedances of a plurality of electrical elements respectively manufactured on a same thermally conductive substrate without requiring adjustment for errors initially and/or over temperature. The correcting comparison module may be configured to make an amplified comparison of the output signal and the reference signal with a weighting substantially equivalent to a nominal value of the first reference sensitivity.

The forward module may include a forward module input resistance and a forward module feedback resistance, and the reference module may include a reference module input resistance in series with, and formed on the same substrate with, the forward module feedback resistance, wherein the active analog signal conditioning circuit may be configured to have a low input range of at least 2 decades, and such that the output signal differs from a magnitude of an ideal nominal transfer function, the transfer function being the forward module feedback resistance divided by the forward module input resistance, by an error on the order of a tracking error between the forward module feedback resistance and the reference module input resistance, regardless of an absolute error between actual resistances and specified nominal resistances of the forward module feedback resistance and the reference module input resistance. The forward module feedback resistance and the reference module input resistance may be formed as a low precision resistor array on a thermally conductive substrate. The forward module feedback resistance and the reference module input resistance may have substantially equivalent resistances. The forward module input resistance may be formed as a high precision input resistor in series with the input signal node. The forward module may further include a forward module op-amp, and the forward module feedback resistance may be configured in feedback with the forward module op-amp to produce the output signal.

The reference module may further include a reference module op-amp, and a reference module feedback resistor configured in feedback with the reference module op-amp to produce the reference signal. The reference signal may be produced with a magnitude of a transfer function, the transfer function being the reference module feedback resistor divided by the forward module input resistance, and inverted relative to the output signal, when the forward module feedback resistor and the reference module input resistance have substantially equal impedances.

The correcting comparison module may include a first high precision comparison resistor to receive the reference signal, a second high precision comparison resistor to receive the output signal, and a correcting comparison module op-amp, wherein the first high precision comparison resistor and the second high precision comparison resistor may be configured to deliver a weighted sum of the reference signal and the output signal to be amplified by the correcting comparison module op-amp to produce the error correction signal. The first high precision comparison resistor and the second high precision comparison resistor may be formed adjacently on a same second substrate as a high precision comparison resistor array. A ratio of the second high precision comparison resistor to the first high precision comparison resistor may be substantially equivalent to a ratio of a nominal specified value of the forward module feedback resistance to the reference module feedback resistor, initially and over temperature. The active analog signal conditioning circuit may be configured such that the error correction signal corrects the output signal for absolute errors of the forward module feedback resistance and without changing the reference signal by using a plurality of feedback paths so a transfer function contribution from a first signal path to the reference signal by the error correction signal is substantially equal in magnitude and inverted in sign as a second signal path such that the error correction signal has substantially zero effect on the reference signal. In other words, the second forward sensitivity multiplied by, or cascaded with, the first reference sensitivity may be equal in magnitude and negative to the second reference sensitivity. This is due to Rpr1 375 being equal to Rpr2 376 in the circuit, as shown in the example embodiment illustrated in FIG. 5.

The forward module may further include a first error correction resistance, the reference module may further include a second error correction resistance, and the first error correction resistance and the second error correction resistance may be high precision resistances formed adjacently on a same third substrate. The first signal path of the error correction signal may be configured through the second forward sensitivity including the first error correction resistance and the forward module feedback resistance, and through the first reference sensitivity including the reference module input resistance and the reference module feedback resistor, the second signal path of the error correction signal may be configured through the second reference sensitivity including the second error correction resistance and the reference module feedback resistor, and the first and second signal paths may be configured such that each results in equal magnitude signals with opposite signs so as to cancel a contribution of the error correction signal to the reference signal output by the reference module. The reference module feedback resistor may be formed on the same third substrate with the first error correction resistance and the second error correction resistance. The active analog signal conditioning circuit may further include one or more additional frequency dependent passive and/or active components configured to provide additional circuit stability, phase compensation, or improved frequency response.

The active analog signal conditioning circuit may further include a signal conditioning circuit including a high signal path resistor configured in series with the forward module input resistance and in feedback to the forward module op-amp to produce a high range output signal, wherein the high signal path resistor and the forward module input resistance may be high precision resistors formed in an array on a same fourth substrate. The signal conditioning circuit may be configured to have a high input range of at least 2 decades, and such that the high output signal differs from a magnitude of an ideal nominal transfer function, the transfer function being the high signal path resistor divided by the forward module input resistance, by an error no greater than the combined errors of the values of the forward module input resistance and the high signal path resistor from their specified nominal values. The active analog signal conditioning circuit may be configured such that the high input range of at least 2 decades is utilized for signals higher than the low input range of at least 2 decades.

The active analog signal conditioning circuit may further include a switching module configured to switch the active analog signal conditioning circuit between the low input range and the high input range by substantially simultaneously interrupting the error correction signal from the correcting comparison module op-amp and changing the forward feedback resistance, and thereby the first forward sensitivity, to activate the high input range, and by substantially simultaneously restoring the error correction signal from the correcting comparison module op-amp and bypassing the high signal path resistor, and thereby changing the first forward sensitivity, to activate the low input range. The high signal path resistor may be connected between the forward module input resistance and the output signal node by closing a switch between the high signal path resistor and the output signal node, thereby changing the first forward sensitivity, and the high signal path resistor may be bypassed by opening the switch between the high signal path resistor and the output signal node. A value of the forward module feedback resistance may be approximately two orders of magnitude higher than a value of the high signal path resistor.

The error correction signal from the correcting comparison module op-amp may be interrupted by opening a switch provided between the correcting comparison module op-amp and the error correction signal node, and the error correction signal from the correcting comparison module op-amp may be restored by closing the switch provided between the correcting comparison module op-amp and the error correction signal node.

In another example embodiment, the forward module may include a forward module feedback resistance, the reference module may include a reference module input resistance in series with, and formed on the same substrate with, the forward module feedback resistance, and the active analog signal conditioning circuit may be configured to have an input range of at least 2 decades, and such that the output signal differs from a magnitude of an ideal nominal transfer function, the transfer function being the forward module feedback resistance, by an error on the order of a tracking error between the forward module feedback resistance and the reference module input resistance, regardless of an absolute error between actual resistances and specified nominal resistances of the forward module feedback resistance and the reference module input resistance.

According to another example embodiment of the present general inventive concept, a method of active analog signal conditioning includes receiving an input signal at an input signal node, outputting an output signal as a conditioned signal to an output signal node, outputting a reference signal to a reference signal node, outputting an error correction signal to an error correction signal node, conditioning and summing the input signal and the error correction signal through a forward module to present the output signal at the output signal node by applying the input signal to a first forward sensitivity between the input signal node and the output signal node, and applying the error correction signal to a second forward sensitivity between the error correction signal node and the output signal node, conditioning and summing the output signal and the error correction signal through a reference module to present the reference signal at the reference signal node, such that the reference signal is inverted in sign to the output signal, by applying the output signal to a first reference sensitivity between the output signal node and the reference signal node, and applying the error correction signal to a second reference sensitivity between the error correction signal node and the reference signal node, and conditioning and summing the output signal and the reference signal through a correcting comparison module to present the error correction signal at the error correction signal node by applying the output signal to a first comparison sensitivity between the output signal node and the error correction signal node, and applying the reference signal to a second comparison sensitivity between the reference signal node and the error correction signal node, wherein the second forward sensitivity and the first and second reference sensitivities are configured such that error correction signal components of the reference signal from the respective first and second reference sensitivities are equal in magnitude and inverted in sign, and wherein the forward module and the reference module each include at least one passive element formed on a same first substrate.

The method may further include making an amplified comparison, in the correcting comparison module, of the output signal and the reference signal with a weighting substantially equivalent to a nominal value of the first reference sensitivity. The reference signal may be produced with a magnitude of a transfer function, the transfer function being the reference module feedback resistor divided by the forward module input resistance, and inverted relative to the output signal, when the forward module feedback resistor and the reference module input resistance have substantially equal impedances. The method may further include correcting the output signal, using the error correction signal, for absolute errors of the forward module feedback resistance and without changing the reference signal by using a plurality of feedback paths so a transfer function contribution from a first signal path to the reference signal by the error correction signal is substantially equal in magnitude and inverted in sign as a second signal path such that the error correction signal has substantially zero effect on the reference signal.

The method may further include producing a high range output signal through a passive signal conditioning circuit including a high signal path resistor configured in series with the forward module input resistance and in feedback to the forward module op-amp, wherein the high signal path resistor and the forward module input resistance are high precision resistors formed in an array on a same fourth substrate. The method may further include utilizing the high signal path resistor for a high input range of at least 2 decades, and bypassing the high signal path resistor for a low input range, the low input range being of at least 2 decades. The method may further include switching between the low input range and the high input range by substantially simultaneously interrupting the error correction signal from the correcting comparison module op-amp and changing the forward feedback resistance, and thereby the first forward sensitivity, to activate the high input range, and by substantially simultaneously restoring the error correction signal from the correcting comparison module op-amp and bypassing the high signal path resistor, and thereby changing the first forward sensitivity, to activate the low input range. The method may further include switching to the high input range by closing a switch between the high signal path resistor and the output signal node to connect the high signal path resistor between the forward module input resistance and the output signal node, thereby changing the first forward sensitivity, and switching to the low input range by opening the switch between the high signal path resistor and the output signal node to bypass the high signal path resistor. Switching to the high input range may further include opening a switch provided between the correcting comparison module op-amp and the error correction signal node to interrupt the error correction signal from the correcting comparison module op-amp, and switching to the low input range may further include closing the switch provided between the correcting comparison module op-amp and the error correction signal node to restore the error correction signal from the correcting comparison module op-amp.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. An active analog signal conditioning circuit comprising:
    an input signal node to receive an input signal;
    an output signal node to output an output signal;
    a reference signal node to output a reference signal;
    an error correction signal node to output an error correction signal;
    a forward module configured to condition and sum the input signal and the error correction signal to present the output signal at the output signal node such that the input signal is applied to a first forward sensitivity between the input signal node and the output signal node, and the error correction signal is applied to a second forward sensitivity between the error correction signal node and the output signal node;
    a reference module configured to condition and sum the output signal and the error correction signal to present the reference signal at the reference signal node such that the reference signal is inverted in sign to the output signal, the output signal is applied to a first reference sensitivity between the output signal node and the reference signal node, and the error correction signal is applied to a second reference sensitivity between the error correction signal node and the reference signal node; and
    a correcting comparison module configured to condition and sum the output signal and the reference signal to present the error correction signal at the error correction signal node such that the output signal is applied to a first comparison sensitivity between the output signal node and the error correction signal node, and the reference signal is applied to a second comparison sensitivity between the reference signal node and the error correction signal node;
    wherein the second forward sensitivity and the first and second reference sensitivities are configured such that error correction signal components of the reference signal from the respective first and second reference sensitivities are equal in magnitude and inverted in sign; and
    wherein the forward module and the reference module are configured to each include at least one passive element formed on a same first substrate.

2. The active analog signal conditioning circuit of claim 1, wherein the active analog signal conditioning circuit is configured to operate over a range of orders of magnitude of input signal amplitudes and/or operating temperatures to produce a signal conditioning accuracy on the order of a matching accuracy of impedances of a plurality of electrical elements respectively manufactured on a same thermally conductive substrate without requiring adjustment for errors initially and/or over temperature.

3. The active analog signal conditioning circuit of claim 1, wherein the correcting comparison module is configured to make an amplified comparison of the output signal and the reference signal with a weighting substantially equivalent to a nominal value of the first reference sensitivity.

4. The active analog signal conditioning circuit of claim 1, wherein the forward module comprises a forward module input resistance and a forward module feedback resistance;
    the reference module comprises a reference module input resistance in series with, and formed on the same substrate with, the forward module feedback resistance;
    wherein the active analog signal conditioning circuit is configured to have a low input range of at least 2 decades, and such that the output signal differs from a magnitude of an ideal nominal transfer function, the transfer function being the forward module feedback resistance divided by the forward module input resistance, by an error on the order of a tracking error between the forward module feedback resistance and the reference module input resistance, regardless of an absolute error between actual resistances and specified nominal resistances of the forward module feedback resistance and the reference module input resistance.

5. The active analog signal conditioning circuit of claim 4, wherein the forward module feedback resistance and the reference module input resistance are formed as a low precision resistor array on a thermally conductive substrate.

6. The active analog signal conditioning circuit of claim 5, wherein the forward module feedback resistance and the reference module input resistance have substantially equivalent resistances.

7. The active analog signal conditioning circuit of claim 4, wherein the forward module input resistance is formed as a high precision input resistor in series with the input signal node.

8. The active analog signal conditioning circuit of claim 7, wherein the forward module further comprises a forward module op-amp; and
    the forward module feedback resistance is configured in feedback with the forward module op-amp to produce the output signal.

9. The active analog signal conditioning circuit of claim 4, wherein the reference module further comprises a reference module op-amp; and
    a reference module feedback resistor configured in feedback with the reference module op-amp to produce the reference signal.

10. The active analog signal conditioning circuit of claim 9, wherein the reference signal is produced with a magnitude of a transfer function, the transfer function being the reference module feedback resistor divided by the forward module input resistance, and inverted relative to the output signal, when the forward module feedback resistor and the reference module input resistance have substantially equal impedances.

11. The active analog signal conditioning circuit of claim 9, wherein the correcting comparison module comprises:
 a first high precision comparison resistor to receive the reference signal;
 a second high precision comparison resistor to receive the output signal; and
 a correcting comparison module op-amp;
 wherein the first high precision comparison resistor and the second high precision comparison resistor are configured to deliver a weighted sum of the reference signal and the output signal to be amplified by the correcting comparison module op-amp to produce the error correction signal.

12. The active analog signal conditioning circuit of claim 11, wherein the first high precision comparison resistor and the second high precision comparison resistor are formed adjacently on a same second substrate as a high precision comparison resistor array.

13. The active analog signal conditioning circuit of claim 11, wherein a ratio of the second high precision comparison resistor to the first high precision comparison resistor is substantially equivalent to a ratio of a nominal specified value of the forward module feedback resistance to the reference module feedback resistor, initially and over temperature.

14. The active analog signal conditioning circuit of claim 13, wherein the active analog signal conditioning circuit is configured such that the error correction signal corrects the output signal for absolute errors of the forward module feedback resistance and without changing the reference signal by using a plurality of feedback paths so a transfer function contribution from a first signal path to the reference signal by the error correction signal is substantially equal in magnitude and inverted in sign as a second signal path such that the error correction signal has substantially zero effect on the reference signal.

15. The active analog signal conditioning circuit of claim 14, wherein forward module further comprises a first error correction resistance;
 the reference module further comprises a second error correction resistance; and
 the first error correction resistance and the second error correction resistance are high precision resistances formed adjacently on a same third substrate.

16. The active analog signal conditioning circuit of claim 15, wherein the first signal path of the error correction signal is configured through the second forward sensitivity including the first error correction resistance and the forward module feedback resistance, and through the first reference sensitivity including the reference module input resistance and the reference module feedback resistor;
 the second signal path of the error correction signal is configured through the second reference sensitivity including the second error correction resistance and the reference module feedback resistor; and
 the first and second signal paths are configured such that each results in equal magnitude signals with opposite signs so as to cancel a contribution of the error correction signal to the reference signal output by the reference module.

17. The active analog signal conditioning circuit of claim 15, wherein the reference module feedback resistor is formed on the same third substrate with the first error correction resistance and the second error correction resistance.

18. The active analog signal conditioning circuit of claim 15, further comprising one or more additional frequency dependent passive and/or active components configured to provide additional circuit stability, phase compensation, or improved frequency response.

19. The active analog signal conditioning circuit of claim 15, further comprising a signal conditioning circuit comprising:
 a high signal path resistor configured in series with the forward module input resistance and in feedback to the forward module op-amp to produce a high range output signal;
 wherein the high signal path resistor and the forward module input resistance are high precision resistors formed in an array on a same fourth substrate.

20. The active analog signal conditioning circuit of claim 19, wherein the signal conditioning circuit is configured to have a high input range of at least 2 decades, and such that the high output signal differs from a magnitude of an ideal nominal transfer function, the transfer function being the high signal path resistor divided by the forward module input resistance, by an error no greater than the combined errors of the values of the forward module input resistance and the high signal path resistor from their specified nominal values.

21. The active analog signal conditioning circuit of claim 19, wherein the active analog signal conditioning circuit is configured such that the high input range of at least 2 decades is utilized for signals higher than the low input range of at least 2 decades.

22. The active analog signal conditioning circuit of claim 19, further comprising a switching module configured to switch the active analog signal conditioning circuit between the low input range and the high input range by substantially simultaneously interrupting the error correction signal from the correcting comparison module op-amp and changing the forward feedback resistance, and thereby the first forward sensitivity, to activate the high input range, and by substantially simultaneously restoring the error correction signal from the correcting comparison module op-amp and bypassing the high signal path resistor, and thereby changing the first forward sensitivity, to activate the low input range.

23. The active analog signal conditioning circuit of claim 22, wherein the high signal path resistor is connected between the forward module input resistance and the output signal node by closing a switch between the high signal path resistor and the output signal node, thereby changing the first forward sensitivity; and
 the high signal path resistor is bypassed by opening the switch between the high signal path resistor and the output signal node.

24. The active analog signal conditioning circuit of claim 23, wherein a value of the forward module feedback resistance is approximately two orders of magnitude higher than a value of the high signal path resistor.

25. The active analog signal conditioning circuit of claim 22, wherein the error correction signal from the correcting comparison module op-amp is interrupted by opening a switch provided between the correcting comparison module op-amp and the error correction signal node; and the error correction signal from the correcting comparison module op-amp is restored by closing the switch provided between the correcting comparison module op-amp and the error correction signal node.

26. The active analog signal conditioning circuit of claim 1, wherein the forward module comprises a forward module feedback resistance;

the reference module comprises a reference module input resistance in series with, and formed on the same substrate with, the forward module feedback resistance; and the active analog signal conditioning circuit is configured to have an input range of at least 2 decades, and such that the output signal differs from a magnitude of an ideal nominal transfer function, the transfer function being the forward module feedback resistance, by an error on the order of a tracking error between the forward module feedback resistance and the reference module input resistance, regardless of an absolute error between actual resistances and specified nominal resistances of the forward module feedback resistance and the reference module input resistance.

27. A method of active analog signal conditioning, the method comprising:

receiving an input signal at an input signal node;

outputting an output signal as a conditioned signal to an output signal node;

outputting a reference signal to a reference signal node;

outputting an error correction signal to an error correction signal node;

conditioning and summing the input signal and the error correction signal through a forward module to present the output signal at the output signal node by applying the input signal to a first forward sensitivity between the input signal node and the output signal node, and applying the error correction signal to a second forward sensitivity between the error correction signal node and the output signal node;

conditioning and summing the output signal and the error correction signal through a reference module to present the reference signal at the reference signal node, such that the reference signal is inverted in sign to the output signal, by applying the output signal to a first reference sensitivity between the output signal node and the reference signal node, and applying the error correction signal to a second reference sensitivity between the error correction signal node and the reference signal node; and conditioning and summing the output signal and the reference signal through a correcting comparison module to present the error correction signal at the error correction signal node by applying the output signal to a first comparison sensitivity between the output signal node and the error correction signal node, and applying the reference signal to a second comparison sensitivity between the reference signal node and the error correction signal node;

wherein the second forward sensitivity and the first and second reference sensitivities are configured such that error correction signal components of the reference signal from the respective first and second reference sensitivities are equal in magnitude and inverted in sign; and wherein the forward module and the reference module each include at least one passive element formed on a same first substrate.

28. The method of claim 27, further comprising making an amplified comparison, in the correcting comparison module, of the output signal and the reference signal with a weighting substantially equivalent to a nominal value of the first reference sensitivity.

29. The method of claim 27, wherein the forward module comprises a forward module input resistance and a forward module feedback resistance;

the reference module comprises a reference module input resistance in series with, and formed on the same substrate with, the forward module feedback resistance;

wherein the active analog signal conditioning circuit is configured to have a low input range of at least 2 decades, and such that the output signal differs from a magnitude of an ideal nominal transfer function, the transfer function being the forward module feedback resistance divided by the forward module input resistance, by an error on the order of a tracking error between the forward module feedback resistance and the reference module input resistance, regardless of an absolute error between actual resistances and specified nominal resistances of the forward module feedback resistance and the reference module input resistance.

30. The method of claim 29, wherein the forward module feedback resistance and the reference module input resistance are formed as a low precision resistor array on a thermally conductive substrate.

31. The method of claim 30, wherein the forward module feedback resistance and the reference module input resistance have substantially equivalent resistances.

32. The active analog signal conditioning circuit of claim 29, wherein the forward module input resistance is formed as a high precision input resistor in series with the input signal node.

33. The method of claim 32, wherein the forward module further includes a forward module op-amp; and the forward module feedback resistance is configured in feedback with the forward module op-amp to produce the output signal.

34. The method of claim 29, wherein the reference module further includes a reference module op-amp; and a reference module feedback resistor configured in feedback with the reference module op-amp to produce the reference signal.

35. The method of claim 34, wherein the reference signal is produced with a magnitude of a transfer function, the transfer function being the reference module feedback resistor divided by the forward module input resistance, and inverted relative to the output signal, when the forward module feedback resistor and the reference module input resistance have substantially equal impedances.

36. The method of claim 34, wherein the correcting comparison module comprises:

a first high precision comparison resistor to receive the reference signal;

a second high precision comparison resistor to receive the output signal; and a correcting comparison module op-amp;

wherein the first high precision comparison resistor and the second high precision comparison resistor are configured to deliver a weighted sum of the reference signal and the output signal to be amplified by the correcting comparison module op-amp to produce the error correction signal.

37. The method of claim 36, wherein the first high precision comparison resistor and the second high precision comparison resistor are formed adjacently on a same second substrate as a high precision comparison resistor array.

38. The method of claim 36, wherein a ratio of the second high precision comparison resistor to the first high precision comparison resistor is substantially equivalent to a ratio of a nominal specified value of the forward module feedback resistance to the reference module feedback resistor, initially and over temperature.

39. The method of claim 38, further comprising correcting the output signal, using the error correction signal, for absolute errors of the forward module feedback resistance and without changing the reference signal by using a plurality of feedback paths so a transfer function contribution from a first signal path to the reference signal by the error correction signal is substantially equal in magnitude and inverted in sign as a second signal path such that the error correction signal has substantially zero effect on the reference signal.

40. The method of claim 39, wherein forward module further comprises a first error correction resistance;
the reference module further comprises a second error correction resistance; and
the first error correction resistance and the second error correction resistance are high precision resistances formed adjacently on a same third substrate.

41. The method of claim 40, wherein the first signal path of the error correction signal is configured through the second forward sensitivity including the first error correction resistance and the forward module feedback resistance, and through the first reference sensitivity including the reference module input resistance and the reference module feedback resistor;
the second signal path of the error correction signal is configured through the second reference sensitivity including the second error correction resistance and the reference module feedback resistor; and
the first and second signal paths are configured such that each results in equal magnitude signals with opposite signs so as to cancel a contribution of the error correction signal to the reference signal output by the reference module.

42. The method of claim 40, wherein the reference module feedback resistor is formed on the same third substrate with the first error correction resistance and the second error correction resistance.

43. The method of claim 40, further comprising producing a high range output signal through a passive signal conditioning circuit including a high signal path resistor configured in series with the forward module input resistance and in feedback to the forward module op-amp;
wherein the high signal path resistor and the forward module input resistance are high precision resistors formed in an array on a same fourth substrate.

44. The method of claim 43, further comprising utilizing the high signal path resistor for a high input range of at least 2 decades, and bypassing the high signal path resistor for a low input range, the low input range being of at least 2 decades.

45. The method of claim 44, further comprising switching between the low input range and the high input range by substantially simultaneously interrupting the error correction signal from the correcting comparison module op-amp and changing the forward feedback resistance, and thereby the first forward sensitivity, to activate the high input range, and by substantially simultaneously restoring the error correction signal from the correcting comparison module op-amp and bypassing the high signal path resistor, and thereby changing the first forward sensitivity, to activate the low input range.

46. The method of claim 45, further comprising switching to the high input range by closing a switch between the high signal path resistor and the output signal node to connect the high signal path resistor between the forward module input resistance and the output signal node, thereby changing the first forward sensitivity; and
switching to the low input range by opening the switch between the high signal path resistor and the output signal node to bypass the high signal path resistor.

47. The method of claim 46, wherein a value of the forward module feedback resistance is approximately two orders of magnitude higher than a value of the high signal path resistor.

48. The method of claim 46, wherein switching to the high input range further comprises opening a switch provided between the correcting comparison module op-amp and the error correction signal node to interrupt the error correction signal from the correcting comparison module op-amp; and
switching to the low input range further comprises closing the switch provided between the correcting comparison module op-amp and the error correction signal node to restore the error correction signal from the correcting comparison module op-amp.

* * * * *